United States Patent [19]

Aboelfotoh et al.

[11] Patent Number: 5,330,592
[45] Date of Patent: Jul. 19, 1994

[54] PROCESS OF DEPOSITION AND SOLID STATE REACTION FOR MAKING ALLOYED HIGHLY CONDUCTIVE COPPER GERMANIDE

[75] Inventors: Mohamed O. Aboelfotoh, Poughkeepsie; Michael J. Brady, Brewster; Lia Krusin-Elbaum, Dobbs Ferry, all of N.Y.

[73] Assignee: International Business Machines Corporation, Armonk, N.Y.

[21] Appl. No.: 148,593

[22] Filed: Nov. 8, 1993

Related U.S. Application Data

[62] Division of Ser. No. 21,146, Feb. 23, 1993, Pat. No. 5,288,456.

[51] Int. Cl.$^5$ .............................................. C22C 9/00
[52] U.S. Cl. ................................. 148/536; 148/537; 420/469
[58] Field of Search ................. 148/536, 537; 420/469

[56] References Cited

U.S. PATENT DOCUMENTS

| | | | |
|---|---|---|---|
| 3,158,504 | 11/1964 | Anderson | 117/213 |
| 3,198,999 | 8/1965 | Baker et al. | 317/234 |
| 3,243,324 | 3/1966 | Kodera et al. | 148/177 |
| 4,201,601 | 5/1980 | D'Silva | 148/32 |
| 4,853,184 | 8/1989 | Naya et al. | 437/195 |
| 5,066,612 | 11/1991 | Ohba et al. | 437/192 |
| 5,073,210 | 12/1991 | Humpston et al. | 148/536 |
| 5,112,699 | 5/1992 | Chang | 428/641 |
| 5,130,274 | 7/1992 | Harper et al. | 437/195 |

FOREIGN PATENT DOCUMENTS

| | | |
|---|---|---|
| 064662 | 11/1982 | European Pat. Off. |
| 179369 | 4/1986 | European Pat. Off. |
| 259616 | 3/1988 | European Pat. Off. |
| 335383 | 10/1989 | European Pat. Off. |
| 55-152144 | 11/1980 | Japan . |
| 58-112336 | 7/1983 | Japan . |
| 61-156823 | 7/1986 | Japan . |
| 2095908 | 10/1982 | United Kingdom . |

OTHER PUBLICATIONS

Krusin-Elbaum et al., "Usually low resistivity of copper germanide thin films formed at lo2 temperatures", *Appl. Phys. Lett. 58*, pp. 1341-1343 (1991).

Chang, "Thermal stability of the Cu/PtSi metallurgy", *J. Appl. Phys. 66*, pp. 2989-2992 (1989).

Chang, "Formation of copper silicides from Cu(100)Si(100) and Cu(111)/Si(111) structures", *J. Appl. Phys. 67*, pp. 566-568 (1990).

Cros, et al., "Formation, oxidation, electronic, and electrical properties of copper silicides", *J. Appl. Phys. 67*, pp. 3328-3336 (1990).

*Primary Examiner*—Upendra Roy
*Attorney, Agent, or Firm*—Scully, Scott, Murphy & Presser

[57] ABSTRACT

The present invention relates to novel compounds that exhibit unusually low electrical resistivity at room temperature. More specifically, it has been discovered that the incorporation of at least 1 to 15 atomic percent of gallium and/or at least 1 to 15 atomic percent gold into stoichiometric copper germanide ($Cu_3Ge$) compound results in a room temperature resistivity comparable to elemental copper, but with superior chemical and electronic stability upon exposure to air or oxygen at high temperatures. Furthermore, the compounds of the present invention have none of the problems associated with the diffusion of copper into elemental and compound semiconductors which oftentimes lead to the degradation of the semiconductor device characteristics. Additionally, the present invention relates to a method of preparing the novel compounds mentioned previously hereinabove.

14 Claims, 3 Drawing Sheets

PROCESS OF DEPOSITION AND SOLID STATE REACTION FOR MAKING ALLOYED HIGHLY CONDUCTIVE COPPER GERMANIDE

This is a divisional of copending application Ser. No. 08/021,146 filed on Feb. 23, 1993 now U.S. Pat. No. 5,288,456.

DESCRIPTION

1. Related Applications

This application is related to pending U.S. application Ser. No. 818,027 filed on Jan. 7, 1992 to the same assignee. This application is also related to U.S. application Ser. No. 876,669 filed on Apr. 30, 1992 to the same assignee. M. O. Aboelfotoh is the primary inventor in each of the related applications as well as the present application.

2. Technical Field

The present invention relates to novel metal alloy compounds that exhibit room temperature electrical resistivity comparable to that of elemental copper. More specifically, the present invention relates to highly oxidation resistant compounds having low resistivity at room temperature comprising a body of stoichiometric copper germanide ($Cu_3Ge$) containing about 1 to 15 atomic percent gallium and/or gold. Furthermore, the present invention relates to a method of preparing the highly oxidation resistant compounds.

PRIOR ART

The continued miniaturization of integrated circuits has brought about an increasing need to reduce the resistance in interconnect and contact metallurgy. In recent years, much effort has been focused on the use of metal silicides to fulfill this need. However, as semiconductor device dimensions become even smaller, both horizontally and vertically, silicides lose their attractiveness. The intrinsic resistivity of the silicides is high compared to metals, while the formation of self-aligned silicides consumes silicon in proportion to the thickness of the silicide that is formed. This consumption usually leads to junction leakage which is intolerable.

Copper, because of its low resistivity, has been used for interconnect and contact application in VLSI and related technologies. However, copper exhibits a high diffusivity in silicon and is generally believed to be detrimental to the performance of silicon due to Cu-induced recombination centers which can reduce the minority carrier lifetime. One possible solution to this problem is the use of copper silicide. However, copper silicide reacts readily with oxygen upon exposure to air or oxygen resulting in degradation of its electrical transport properties. Another possible solution to this problem is to alloy the copper with other metals. However, this typically results in an increase in the resistivity of the alloyed material. Thus, research is ongoing in an attempt to provide a material for semiconductor devices that has low resistivity and is highly stable when exposed to air or oxygen for use in interconnect and contact applications.

One such material for use in semiconductor devices is disclosed in U.S. Pat. No. 3,198,999 to Baker et al. The reference relates to a non-injecting ohmic contact for semiconductor devices using a copper-gold-germanium ternary alloy. This ternary alloy is formed by coating the base material which is directly bonded to the semiconductive body with a first layer of copper and a second layer of gold. The relative amounts by weight of the material is said to be strictly maintained in ratios from 1:1 to about 1:3 of copper to gold in the respective layers of the coating.

U.S. Pat. No. 3,243,324 to Kodera et al. describes a method of fabricating semiconductor devices by alloying gold with germanium, or with gallium doped with germanium to improve ohmic contacts. This alloyed material is said to have improved semiconductor characteristics and reproducability. Despite these improvements the reference fails to address the problem of lowering the resistivity of the semiconductor material.

U.S. Pat. No. 3,468,659 to Belasco et al. provides a semiconductor contact alloy for forming ohmic contacts to n-type material, and for forming an emitter of an npn group III-V compound transistor. More specifically, the invention relates to a metal alloy, comprising gold, germanium, and a donor impurity such as tin, sulfur, selenium or tellurium to provide an emitter contact to P-type GaAs, or an ohmic contact to N-type material. This alloy, which contains 30% Au, 65% Ge, and 5% donor impurity by weight, is said to withstand operating temperatures as high as the upper limit of a GaAs transistor.

U.S. Pat. No. 3,765,956 to Li relates to solid-state devices, and more particularly to melt-grown solid-state devices having unique operating characteristics and/or structure. Moreover, the reference describes a solid-state device containing melts, eutectics and intermettalics to improve these device characteristics by using melts of copper and germanium, germanium and gold and gallium, and copper and gold.

U.S. Pat. No. 4,786,469 to Weber et al. describes a grain refinement method for copper based metals in which the metal to be grain refined is alloyed with germanium or gallium. The copper based metals which have been successfully grained refined by the method of the invention include alpha-beta brasses, alpha-brasses, bronzes, gunmetals and the like thereof.

U.S. Pat. No. 5,001,536 to Fukuzawa et al. relates to multilayered-structure semiconductor device which has enhanced hole mobility and which can generate a sufficient signal current. More specifically, the reference provides a semiconductor device using an alloy of gold and germanium and nickel as electrodes.

None of the above references however address the formation of a stoichiometric copper germanide compound ($Cu_3Ge$) containing small amounts of gallium and/or gold to achieve room-temperature resistivity comparable to that of elemental copper, but with superior thermal and chemical stability upon exposure to air or oxygen at room temperatures as does the present invention.

SUMMARY OF THE INVENTION

The present invention relates to novel metal alloy compounds that exhibit low electrical resistivity at room temperature. More specifically, it has been discovered that the incorporation of at least 1 to 15 atomic percent of gallium and/or at least 1 to 15 atomic percent gold into stoichiometric copper germanide ($Cu_3Ge$) metal alloy compound results in a room temperature resistivity comparable to that of elemental copper or aluminum, but with superior chemical and electronic stability upon exposure to air or oxygen at high temperatures. In other words, the chemical and electrical stability of the compounds of the present invention are vastly superior to those compounds previously disclosed in the prior art.

Furthermore, the compounds of the present invention do not exhibit any of the problems normally associated with the diffusion of copper into elemental and compound semiconductors which oftentimes lead to the degradation of the semiconductor device characteristics. Due to their robust electronic and thermal properties, the novel metal alloy compounds of the present invention are extremely useful as contacts and interconnections in Si and SiGe semiconductor devices.

Additionally, the present invention relates to a method of preparing the novel metal alloy compounds mentioned previously hereinabove by depositing sequential layers of gallium and/or gold prior to the deposition of a copper layer on to a semiconductor substrate which contains a layer of germanium thereon and thereafter annealing at a temperature in the range from about 150° C. to about 500° C. for 15 min. to about 3 hours.

These and other aspects of the present invention are achieved by providing a method for preparing highly oxidation resistant compounds comprising the steps of: providing a semiconductor substrate having a Ge layer deposited thereon; depositing a layer of material on said substrate wherein said material is selected from the group of materials consisting of Ga, Au or mixtures of Ga and Au; depositing a layer of Cu on said material layer; and heating said substrate and material layers to a temperature in the range from about 150° C. to about 500° C. for a period of time from about 15 min. to about 3 hours to produce the stoichiometric $Cu_3Ge$ containing said material. Furthermore the present invention also relates to the low resistivity compounds produced by the process of the present invention.

DESCRIPTION OF THE PREFERRED EMBODIMENT

In accordance with the present invention, highly oxidation resistant compounds having resistivity values comparable to those of pure copper or aluminum are prepared. In addition, the compounds of the present invention are chemically stable, robust and do not exhibit any of the problems associated with the diffusion of copper into elemental and compound semiconductors which ultimately results in the degradation of the semiconductor device. The term robust is used herein to signify that the compounds of the present invention are highly resistant to oxidation when they are exposed to air or oxygen. Thus, the compounds of the present invention represent an advancement in the art due to their low electrical resistivity and oxidation resistance properties. The compounds of the present invention are therefore extremely useful for applications as interconnects and contacts in semiconductor devices.

In accordance with the inventive method, the incorporation of 1 to 15 atomic percent gallium and/or gold into a stoichiometric copper germanide ($Cu_3Ge$) compound results in lowering the resistivity of the compound to a value that is comparable to that of elemental copper or aluminum. More preferably, the atomic percent of gallium and/or gold incorporated into the $Cu_3Ge$ compound is from 1 to 5. The most preferred range of gallium and/or gold incorporated into the stoichiometric $Cu_3Ge$ compound is from 1 to 3 atomic percent.

Figure 1:
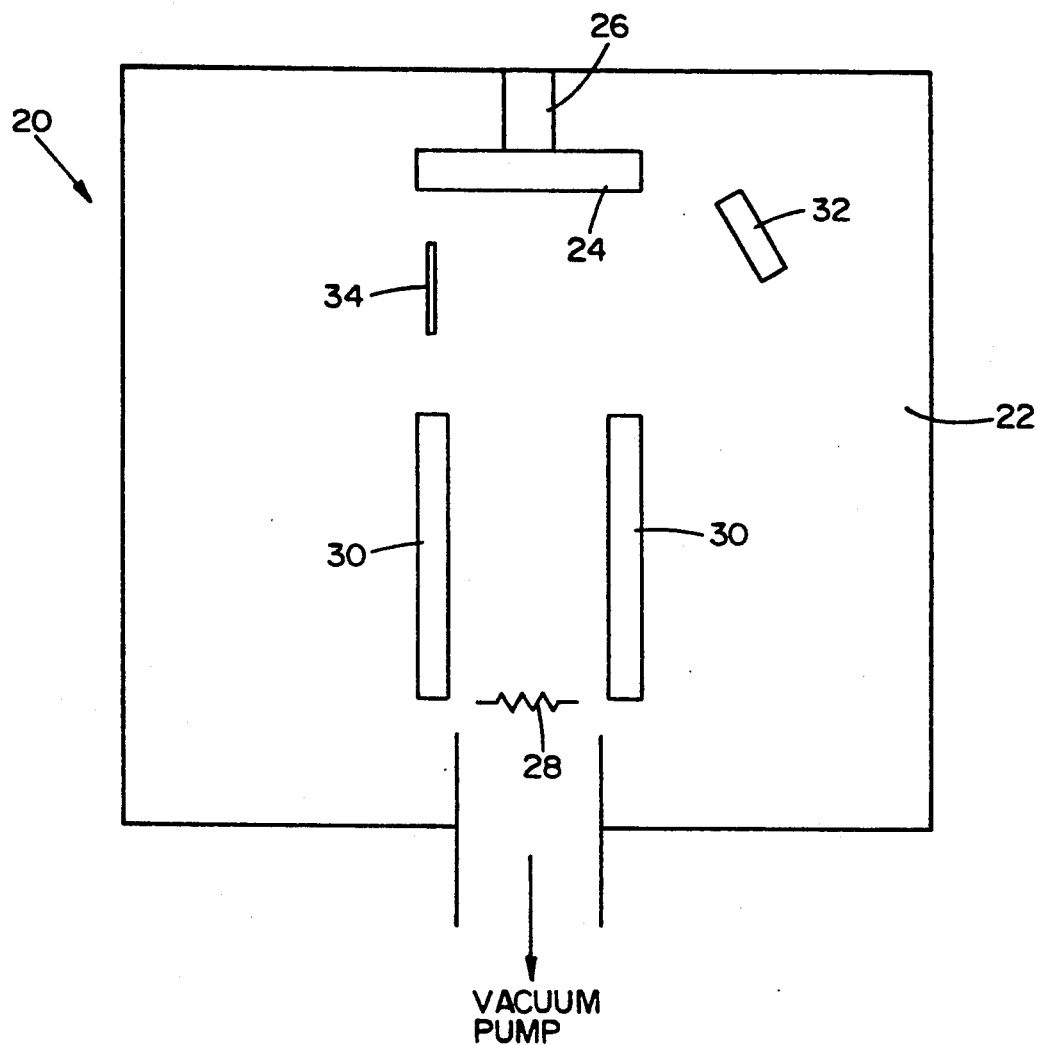
FIG. 1 is a schematic drawing which illustrates a typical apparatus used in the method of the invention.

The method of the present invention may be carried out in a typical E-beam evaporation apparatus as shown in FIG. 1 or by other means well known in the art such as sputtering or boat evaporation. The preferred apparatus is an E-beam apparatus. The E-beam apparatus 20 includes a deposition chamber 22 having a semiconductor substrate 24 disposed on a turret 26 and a high vacuum pump not shown for evacuating the deposition chamber 22 prior to the initiation of the sequential deposition process. The E-beam apparatus 20 also includes a high current source 28 which causes effective emission of electrons from the source and magnetic poles 30 which are positioned adjacent to the current source 28 to cause bending of the electron beam. The apparatus 20 further includes a shutter 34 and a crystal rate monitor 32 which are employed in the present apparatus to control the thickness of the films being deposited onto the surface of the semiconductor substrate. In other words, the film thickness which is being deposited is controlled by measuring the change of frequency on the surface of the crystal rate monitor 32.

The substrates employed by the present invention may be any semiconductor substrate well known in the art such as Si, SiGe, GaAs and the likes thereof. Preferably the semiconductor substrate is a single crystal which has a <100> crystal structure. The most preferred semiconductor substrate of the present invention is a Si <100> single crystal.

The films employed by the present invention are prepared by methods well known in the art, such as chemical vapor deposition, evaporation and the like. Mixtures of the semiconductor substrates as defined above are also contemplated by the present invention. For example, an epilayer of GaAs may be deposited on the surface of a Si <100> single crystal prior to the sequential deposition of the other elements. This GaAs epilayer which is formed on the surface of the Si substrate is prepared by molecular beam epitaxy or by any other suitable technique well known in the art for depositing such a layer.

In accordance with the method of the present invention, the substrate is placed into the E-beam apparatus 20 and then the deposition chamber 22 is pumped down to a low vacuum to remove any air or oxygen that may be present on the surface of the substrate or in the E-beam apparatus itself. Typically, the deposition chamber 22 is evacuated until a pressure reading of about $1 \times 10^{-7}$ to about $1 \times 10^{-8}$ Torr is obtained. Most preferably, this evacuation step is conducted until a constant pressure reading of about $1 \times 10^{-7}$ Torr is obtained.

Thereafter, sequential layers of germanium, gallium and/or gold, and copper are deposited onto the surface of the substrate at room temperature. Each of these elements are essentially pure, however, minor amounts of impurities may be tolerated by the present invention. It is especially preferred that these compounds do not come into contact with air or oxygen during the deposition process since contact with air or oxygen will cause oxidation to occur.

Therefore, the sequential deposition process of the present invention is conducted in a vacuum or an inert gas atmosphere.

In accordance with a preferred embodiment of the present invention, germanium is first deposited onto the surface of the semiconductor substrate until a thin layer of about 700 to about 800 Å is obtained. More preferably, the germanium is deposited so that a thin film of about 750 to about 775 Å is obtained on the surface of the semiconductor substrate.

After forming the Ge-substrate, thin layers of gallium and/or gold are then deposited onto the surface of the thus formed Ge-substrate.

When gallium is used alone, a thin layer of about 50 to about 100 Å is deposited on to the Ge-substrate. This layer thickness of gallium which is deposited corresponds to about 1 to about 3 atomic percent of gallium in the final product.

When gold is employed in the deposition process of the present invention, it is preferred that the gold layer be embedded between two Ge layers. In accordance with this embodiment, a thin layer of Ge of about 350 Å is first deposited onto the semiconductor substrate, followed by a thin layer of gold (50 Å) and another layer of Ge (350 Å). In accordance with this embodiment, the total amount of Ge deposited should equate to 700 Å. This thin layer of gold which is deposited corresponds to about 1-2 atomic percent of gold in the final product after annealing.

When a mixture of Ga and Au is employed, it is especially preferred that the Ga layer has a film thickness of about 10 to about 50 Å while the Au layer has a thickness of about 10 to about 50 Å. This film thickness Ga and Au correspond to about 1-2 atomic % of Ga and 1-2 atomic % of Au in the final product.

After depositing the Ga and/or Au onto the surface of the Ge-substrate, a thin layer of copper from about 500 to about 2000 Å is then deposited onto the surface. Preferably, the copper is deposited so that a thin layer of copper from about 1200-1400 Å is formed on the surface. Most preferably, the copper is deposited so that a thin layer of about 1300 Å is formed.

The deposition of the various layers on to the semiconductor substrate surface is usually conducted at a temperature of about −200° to about +400° C. Preferably, the deposition temperature of the various layers on to the semiconductor substrate surface is at room temperature.

After this sequential deposition process has been concluded, the substrate containing the deposited layers is then subjected to in-situ annealing either under vacuum or an inert gas atmosphere. In accordance with the method of the present invention, the in-situ annealing process is conducted at a temperature from about 150° to about 500° C. for a time period of about 15 minutes to 3 hours. More preferably, the in-situ annealing is conducted at a temperature of about 200° to about 450° C. for a time period of about 15 min. to 1.5 hour. Most preferably, the annealing is conducted at atmosphere of about 400° C. for 30 minutes.

It should be noted that copper is easily oxidized when exposed to air or oxygen. Thus, as mentioned previously, the present invention prevents copper oxidation from occurring by conducting the annealing process in a vacuum or an inert gas atmosphere. If an inert gas atmosphere is employed, the gases should be essentially pure containing little or no traces of oxygen or water. Suitable inert gases that may be employed by the present invention are He, Ar, $N_2$ and the like.

After cooling the newly formed compounds down to ambient temperature, the electrical resistivity values of the compounds were determined using a four point probe method. Basically, the four point probe method measures the electrical resistivity of a substrate as a function of the temperature. By employing this method, the electrical resistivity of the compounds of the present invention are found to be in the range of about 2.6 to about 2.9 $\mu\Omega$.cm at a temperature of 180° K. from samples that have a total film thickness of about 2000 Å. These values are comparable to those reported for elemental copper (2–2.5 $\mu\Omega$.cm at room temperature). Additionally, the compounds prepared by the present invention are highly resistant to oxidation when exposed to air or oxygen therefore the compounds are applicable for use as contact and interconnections in semiconductor devices.

The electrical resistivity values of the present invention are lower than the resistivity value reported for 2000 Å thick film of $Cu_3Ge$ which is reported to be 5–6 $\mu\Omega$ cm. This is somewhat surprising since one skilled in the art would expect that the electrical resistivity should increase when additional components are added to the alloy.

The following examples are given to illustrate the scope of the present invention. Because these examples are given for illustrative purposes only, the invention embodied therein should not be limited thereto.

EXAMPLE I

The following example is given to illustrate the process of sequential deposition of Ge, Ga and Cu onto a semiconductor substrate.

The semiconductor substrate employed in this example is a Si <100> single crystal. The Si substrate was loaded on to the turret of the E-beam apparatus as shown in FIG. 1. Thereafter, the system was evacuated to a partial pressure reading of about $1 \times 10^{-7}$ Torr. After maintaining this pressure reading for a period of time, the sequential deposition of germanium, gallium and copper was initiated. This sequential process was carried under vacuum at room temperature thus avoiding contact with air or oxygen which may cause oxidation to occur. A thin film of germanium of about 700 Å was first deposited on to the surface of the Si <100> crystal. Thereafter, 5–10 atomic percent of gallium was deposited on to the surface of the Ge-film and a thin film of about 1300 Å of copper was deposited on top of the gallium film.

Figure 2:
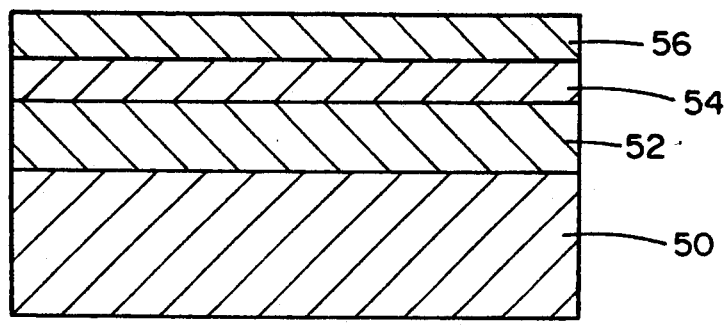
FIG. 2 is a schematic drawing showing the cross-section of a semiconductor substrate having a Ge layer deposited thereon and including the deposition of Ga and Cu layers using the sequential deposition method of the present invention prior to annealing.

Upon completion of the sequential deposition process, the substrate containing layers of Ge, Ga and Cu were then subjected to in-situ annealing at 400° C. for 30 minutes in vacuum. FIG. 2 is a schematic drawing which illustrates the different layers which are deposited on to the Si substrate. More specifically, FIG. 2 is a schematic drawing showing one embodiment of the present invention wherein Ge, Ga and Cu are sequentially deposited onto the surface of a semiconductor substrate. In this figure, the semiconductor substrate 50 is a <100> single crystal of Si. A thin layer of Ge 52 is deposited onto the surface of the semiconductor substrate 50. Thereafter, thin layers of Ga 54 and Cu 56 are deposited onto the Ge-containing substrate prior to the annealing process.

Figure 3:
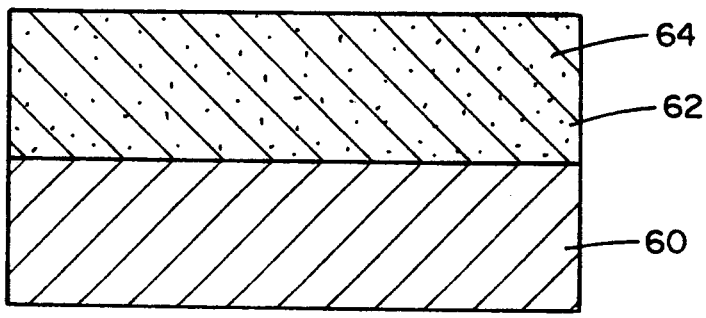
FIG. 3 is a schematic drawing showing the annealed product formed containing the components described in FIG. 2.

This process of sequential deposition and annealing results in a compound that has an electrical resistivity value as measured by the four point probe method of about 3.4 $\mu\Omega$.cm at room temperature. FIG. 3 is a schematic drawing showing the final product formed after annealing. In this figure, the Si semiconductor substrate 60 contains a layer of stoichiometric $Cu_3Ge$ 62 which has 1 to 2 atomic percent Ga 64 incorporated therein.

Figure 5:
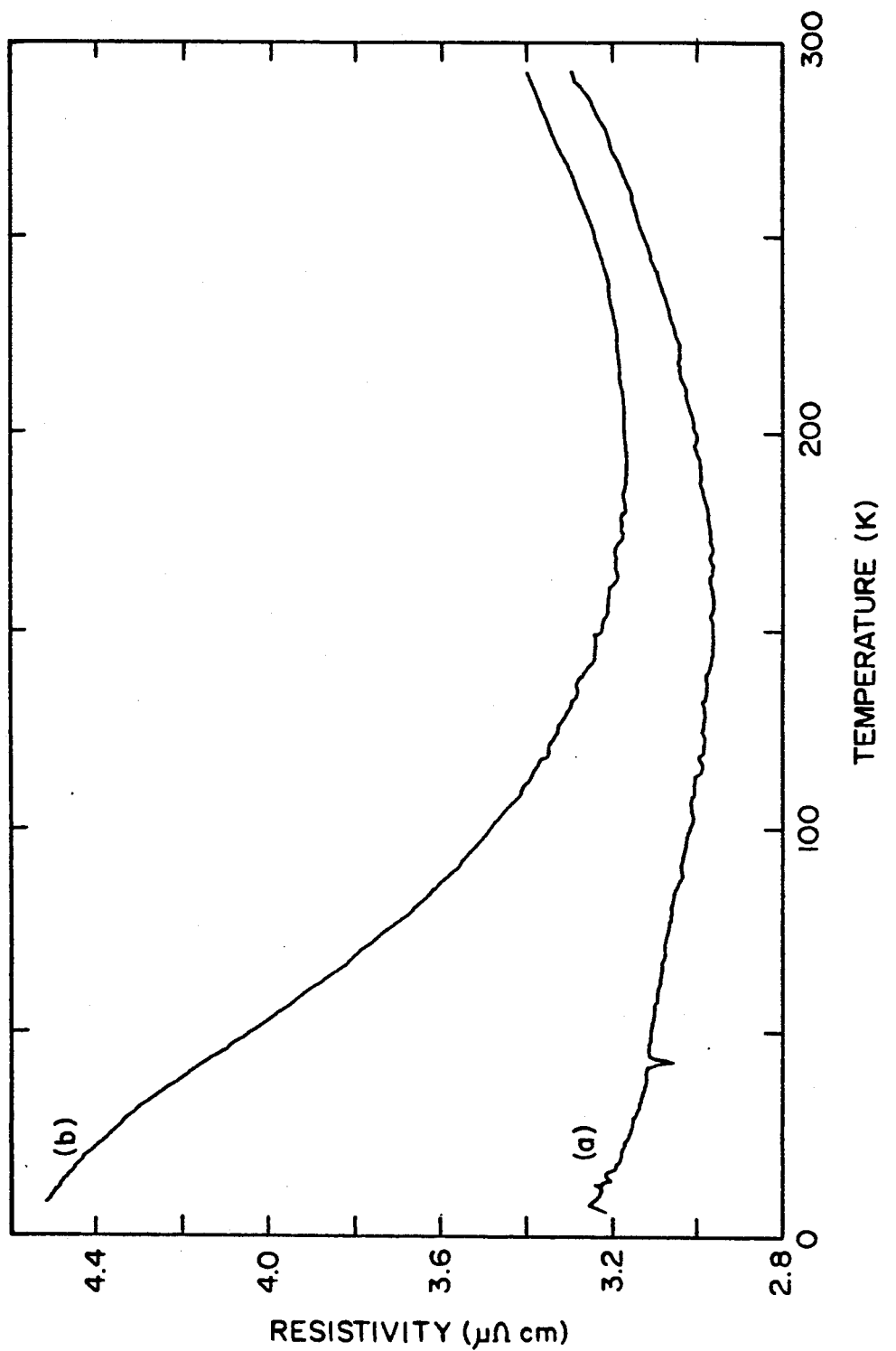
FIG. 5 is a plot of the resistivity vs. temperature for (a) $Cu_3Ge$ substrate having 1-2 atomic % Ga incorporated therein and (b) $Cu_3Ge$ substrate having a mixture of Au and Ga incorporated therein.

FIG. 5(b) illustrates that by optimizing the Ga content reduction in the semiconductor upturn in $\rho$ vs T results in low, and almost temperature independent electrical resistivity. This characteristic, coupled with the total resistance of this compound to oxidation, makes it extremely useful in applications for contacts and metallization.

COMPARATIVE EXAMPLE I

This example is given to compare the electrical resistivity values of a $Cu_3Ge$ thin film with that of the compound described in Example I.

The compound of this comparative example was prepared in a similar manner as described in Example I except that no gallium was incorporated into the sequential deposition process.

This resulted in a compound that has an thin film of $Cu_3Ge$ of about 2000 Å on its surface. Moreover, the resistivity of this compound was determined to be between 5 and 6 $\mu\Omega$.cm. This value is about a factor of 3 higher that reported in Example I which is surprising since one skilled in the art would expect that further alloying as in Example I would result in an increase in the resistivity of the compound. Clearly, the incorporation of Ga into stoichiometric $Cu_3Ge$ results in a different compound than $Cu_3Ge$ evident by different resistivity values reported herein.

EXAMPLE II

Figure 4:
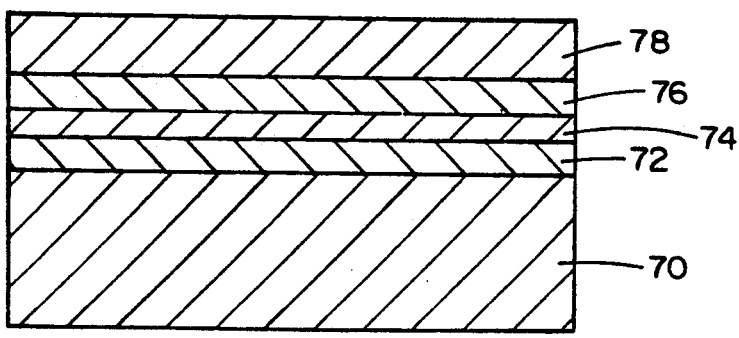
FIG. 4 is a schematic drawing showing the cross-section of a semiconductor substrate having a Ge layer deposited thereon and including the deposition of Au and Cu layers using the sequential deposition method of the present invention prior to annealing.

This example illustrates another embodiment of the present invention wherein a Au/Ga mixture is used in the sequential deposition process. FIG. 4 is a schematic drawing illustrating the different layers which are sequentially deposited onto the Si substrate. In this figure, the semiconductor substrate 70 is <100> Si. A thin layer of about 350 Å of Ge 72 is deposited onto the semiconductor substrate 70. Thereafter, a thin layer of Au 74 and another layer of Ge 76 of about 350 Å are deposited onto the substrate's surface so that the Au layer 74 is embedded between the Ge layers 72 and 76. Finally, a thin layer of Cu 78 is deposited onto the surface prior to annealing.

The compound was prepared in accordance with the procedure described in Example I however a mixture of Ga and Au was incorporated instead of only Ga. After annealing, the final product is similar to FIG. 3 however the layer containing the stoichiometric $Cu_3Ge$ compound had 1-2 atomic % Ga and 1-2 atomic % Au incorporated therein.

FIG. 5(a) illustrates the $\rho$ vs T. graph for this example. The plot illustrates that by incorporating a mixture of Ga and Au into stoichiometric $Cu_3Ge$ results in a slight semiconductor upturn as compared to Example I. Despite this upturn in the $\rho$ vs T. plot, the incorporation of Ga and Au resulted in a compound that has a room temperature resistivity of about 3.2 $\mu\Omega$.cm, which is comparable that of elemental copper.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for preparing a highly oxidation resistant compound comprising the steps of:
   (a) providing a semiconductor substrate having a Ge layer deposited thereon;
   (b) depositing a layer of material on said substrate, said material being selected from the group consisting of Ga, Au and mixtures of Ga and Au;
   (c) depositing a layer of Cu on said material layer; and
   (d) annealing said substrate and material layers at a temperature in the range from about 150° C. to about 500° C. for a period of about 15 minutes to about 3 hours to produce a stoichiometric $Cu_3Ge$ compound containing said material.

2. The method of claim 1 wherein the annealing of said substrate and material layers is conducted at a temperature of 400° C. for about 30 minutes.

3. The method of claim 1 wherein said material comprises Ga in an amount from about 1 to 15 atomic % of said compound.

4. The method of claim 1 wherein said material comprises Au in an amount from about 1 to 15 atomic % of said compound.

5. The method of claim 1 wherein said material comprises Ga and Au in an amount from about 1 to 15 atomic % of said compound.

6. The method of claim 1 wherein said layer of said material is deposited to a film thickness of 1500 to about 2000 Å.

7. The method of claim 1 wherein the layer of said material deposited on said substrate is deposited by E-beam evaporation, sputtering or boat evaporation.

8. The method of claim 1 wherein said highly oxidation resistant compound has an electrical resistivity value of about 2.6 to about 2.9 $\mu\Omega$.cm at 180° K.

9. The method of claim 3 wherein said material comprises Ga in an amount from about 1 to 5 atomic % of said compound.

10. The method of claim 4 wherein said material comprises Au in an amount from about 1 to 5 atomic % of said compound.

11. The method of claim 5 wherein said material comprises Ga and Au in an amount from about 1 to 5 atomic % of said compound.

12. The method of claim 9 wherein said material comprises Ga in an amount from about 1 to 3 atomic % of said compound.

13. The method of claim 10 wherein said material comprises Au in an amount from about 1 to 2 atomic % of said compound.

14. The method of claim 11 wherein said material comprises Ga and Au in an amount from about 1 to 3 atomic % of said compound.

* * * * *

UNITED STATES PATENT AND TRADEMARK OFFICE
CERTIFICATE OF CORRECTION

PATENT NO. : 5,330,592
DATED : July 19, 1994
INVENTOR(S) : Osama Aboelfotoh, et al It is certified that error appears in the above-indentified patent and that said Letters Patent is hereby corrected as shown below:

On the Title Page, Section [56], under "OTHER PUBLICATIONS" insert the following:

Thompson et al., "Low temperature gettering of Cu, Ag and Au acros a wafer of Si by Al", Appl. Phys. Lett. 5, pp. 440-442 (1982)--

On the Title Page, Section [56] under "OTHE PUBLICATIONS", line 1: "Usually" should read --Unusually-- an line 2: "lo2" should read --low--

Column 6, lines 20 & 23: ".cm" should read --·cm--

Column 7, lines 11 & 35: ".cm" should read --·cm--

Column 8, line 4: ".cm" should read --·cm--

Column 8, line 48, Claim 8: ".cm" should read --·cm--

Signed and Sealed this

First Day of August, 1995

Attest:

BRUCE LEHMAN

Attesting Officer    Commissioner of Patents and Trademarks